United States Patent
Hsieh et al.

(10) Patent No.: US 6,174,765 B1
(45) Date of Patent: Jan. 16, 2001

(54) METHOD OF REDUCING LEAKAGE CURRENT IN DIELECTRIC

(75) Inventors: Wen-Yi Hsieh; Kuo-Tai Huang, both of Hsinchu (TW)

(73) Assignee: United Microelectronics Corp. (TW)

( * ) Notice: Under 35 U.S.C. 154(b), the term of this patent shall be extended for 0 days.

(21) Appl. No.: 09/010,005

(22) Filed: Jan. 21, 1998

(30) Foreign Application Priority Data

Nov. 27, 1997 (TW) .................................................. 86117832

(51) Int. Cl.⁷ .................................................. H01L 21/8242
(52) U.S. Cl. ......................... 438/240; 438/592; 438/785
(58) Field of Search .................... 438/264, 261, 438/216, 287, 591, 785, 240; 427/78–81, 99, 126.3

(56) References Cited

U.S. PATENT DOCUMENTS

| | | | | |
|---|---|---|---|---|
| 4,201,798 | * | 5/1980 | Lindmayer | 427/74 |
| 5,304,503 | * | 4/1994 | Yoon | 437/43 |
| 5,439,845 | * | 8/1995 | Watanabe | 437/130 |
| 5,508,221 | * | 4/1996 | Kamiyama | 437/60 |
| 5,723,361 | * | 3/1998 | Azuma | 437/180 |
| 5,731,220 | * | 3/1998 | Tsu | 437/60 |
| 5,837,593 | * | 11/1998 | Park | 438/396 |
| 5,859,760 | * | 1/1999 | Park | 361/313 |
| 5,861,332 | * | 1/1999 | Yu | 438/240 |
| 5,913,117 | * | 6/1999 | Lee | 438/240 |

OTHER PUBLICATIONS

Ohnishi, S., et al., "Ultrathin Oxide/Nitride/Oxide/Nitride Multilayer films for Mbit DRAM Capacitors", Extended Abstracts of the 1992 International Conference on Solid State Devices and Materials, Tsukuba, 1992, pp. 67–69.*

* cited by examiner

Primary Examiner—Charles Bowers
Assistant Examiner—Erik Kielin
(74) Attorney, Agent, or Firm—Rabin & Champagne PC

(57) ABSTRACT

A method of reducing the leakage current of a dielectric layer of a capacitor. A substrate having a dielectric layer formed thereon is disposed into a furnace. A first annealing step is performed for nucleation. A second annealing step is performed to control the number of the nuclei. A third annealing step is performed for grain growth.

12 Claims, 1 Drawing Sheet

METHOD OF REDUCING LEAKAGE CURRENT IN DIELECTRIC

CROSS-REFERENCE TO RELATED APPLICATION

This application claims the priority benefit of Taiwan application serial no. 86117832, filed Nov. 27, 1997, the full disclosure of which is incorporated herein by reference.

BACKGROUND OF THE INVENTION

1. Field of the Invention

The invention relates to a method for fabricating a capacitor in an integrated circuit (IC), and more particular to a method of reducing the leakage current in a dielectric material with a high dielectric constant by using three steps of annealing processes.

2. Description of the Related Art

In a DRAM, the typical method to access data is by charging or discharging optionally into each capacitor of the capacitor array on the semiconductor substrate.

Due to the higher and higher integration of IC, dimensions of devices or structures (such as transistors, capacitors) become smaller and smaller. Thus, the storage of charges (that is, the capacitance) of the capacitor in the design of a conventional planar capacitor decreases. The decrease of charge storage causes various problems, including mechanical deterioration and charge leakage by the larger susceptibility, and therefore, causes potential loss. The charge leakage caused by larger susceptibility may cause more frequent refresh period, and by which, memory can not handle data saving and reading properly. Moreover, the decrease of charge storage may need more complex data reading plan, or more sensitive charge induction amplifier.

Up to now, there are three ways to solve the problem of low capacitance of a capacitor resulted from the higher integration in a very large scaled integrated circuit. The first method is to reduce the thickness of the dielectric layer between two conductors of the capacitor. It is known that the capacitance is proportional to the inverse of distance between two conductors in a capacitor. Thus, the decrease of the thickness of dielectric layer increases the capacitance effectively. However, according to the consideration of the uniformity and stability of the dielectric layer, this is a method difficult to control. The second method is to increase the surface area of the storage node of the capacitor. The capacitance is proportional to the surface area of storage node, that is, the conductor (electrode). Therefore, to increase the surface area of the storage node increases the capacitance as well. The very common structure for increasing the surface area is the fin-shape, box-shape structure, or hemispherical grain structure. These kinds of structures are complex for fabrication, and thus, cause the difficulty in mass production. The third method, which is the most direct method, is to adapt the material with high dielectric constant, such as, tantalum oxide ($Ta_2O_5$), as the dielectric layer. However, in the conventional process, the high leakage current and low breakdown voltage caused by the arrangement of tantalum oxide still needs to be improved.

In a conventional DRAM process, after deposition, a tantalum oxide layer formed on a substrate is in an amorphous state. An annealing process is performed to transform the amorphous tantalum oxide layer into a crystalline state. Referring to FIG. 1, a relation between temperature and annealing time for transforming the amorphous tantalum oxide layer into a crystalline tantalum oxide layer is shown.

To performed a rapid thermal anneal, the substrate is put in an environment of nitrous oxygen ($N_2O$) at a temperature of about 800° C. for about tens of seconds, for example, 60 seconds. The lattice of the tantalum oxide layer is re-arranged by absorbing thermal energy. That is, a step of nucleation and grain growth of the tantalum oxide layer is performed to obtain a more regular structure. However, though the tantalum oxide layer is re-nucleated and grown, due to the very short time of the annealing process, the obtained grain size of tantalum oxide layer is still too small. Therefore, the leakage current of tantalum oxide layer is still considerable.

SUMMARY OF THE INVENTION

It is therefore an object of the invention to provide a method for fabricating a capacitor in an integrated circuit. A material with a high dielectric constant is in use as the dielectric layer to obtain a higher capacitance. By expanding the conventional single annealing process to three steps, the number of nuclei is reduced, and the size of the grains is enlarged. Therefore, the resultant lattice structure of the dielectric layer becomes more regular, and the leakage current is reduced.

To achieve these objects and advantages, and in accordance with the purpose of the invention, as embodied and broadly described herein, the invention is directed towards a method of reducing the leakage current of a dielectric layer of a capacitor. A substrate having a dielectric layer formed thereon is disposed into a furnace. A first annealing step is performed for nucleation. A second annealing step is performed to control the number of the nuclei. A third annealing step is performed for grain growth.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

In the invention, to obtain a higher capacitance, a material with high dielectric constant is used as the dielectric layer, such as a tantalum oxide layer, an oxide/nitride/oxide (ONO) layer, or a BST, of a capacitor. A substrate having a dielectric layer is put into a furnace to perform a first step of anneal, that is, a mediate temperature annealing step. During the mediate temperature anneal, nuclei of tantalum oxide are formed without growing. By reducing the temperature, in the second step of anneal, that is, in a low temperature annealing step, the speed of nucleation is reduced and the number of nuclei is suppressed. A third step of anneal, that is, a high temperature annealing step, is then performed by increasing the temperature. During the third step of anneal, the speed of grain growth is much faster than the speed of nucleation. The part which is not nucleated in the first step of anneal is absorbed by the nuclei rather than being nucleated. The nuclei have a larger space to grow. The resultant size of grains is much larger than the conventional one. The leakage current is thus reduced. A detail description is given as the follows.

On a substrate, if tantalum oxide layer is used as the dielectric layer, tetra-acetyl-ethyl-tantalum-oxide (TAETO) is used as precursor, a tantalum oxide layer is formed by low pressure chemical vapour deposition (LPCVD). The tantalum oxide formed by LPCVD is in an amorphous state. Therefore, the substrate is put into a furnace for rapid thermal anneal for lattice re-arrangement.

Figure 1:
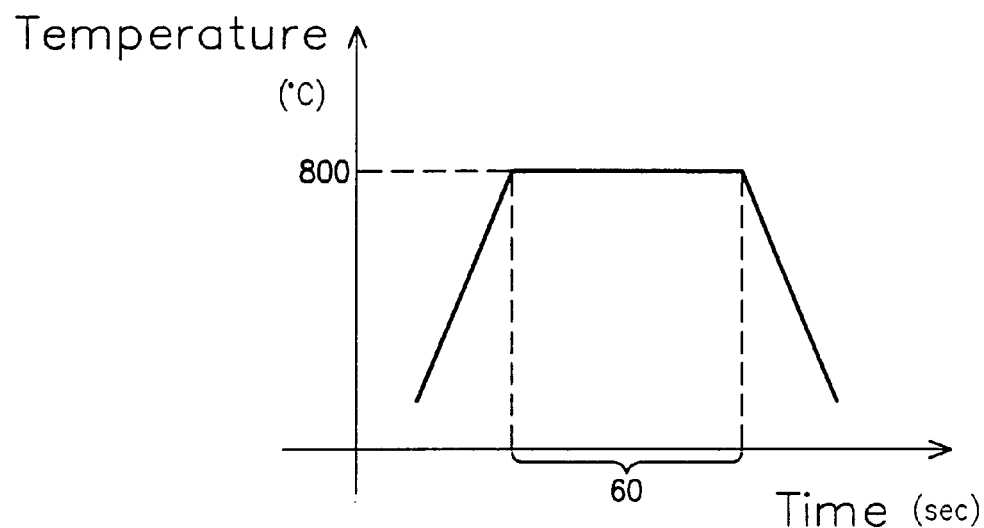
FIG. 1 shows a relation between temperature and annealing time of a conventional annealing process.
Figure 2:
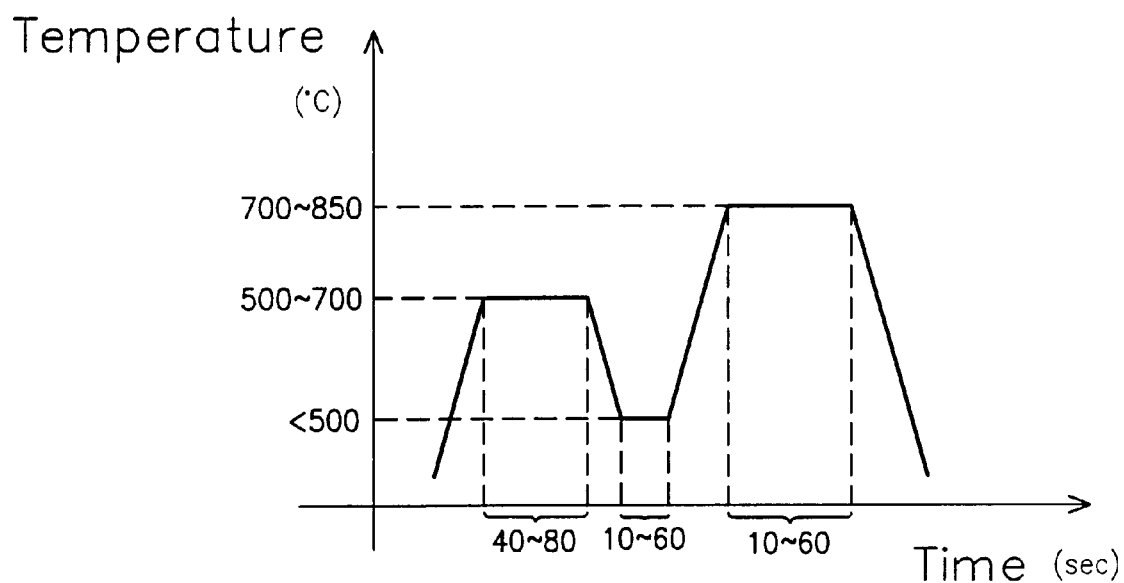
FIG. 2 shows a relation between temperature and annealing time of a annealing process in a preferred embodiment according to the invention.

Referring to FIG. 2, the temperature of the furnace is set at about 500° C. to 700° C., preferably at 600° C. during the first annealing step 1. The first annealing step is a mediate temperature anneal. The annealing time for step 1 is about 40 seconds to 80 seconds, preferably 60 seconds. At the temperature of about 600° C., the thermal energy can only supply the tantalum oxide layer for nucleation without grain growth. Therefore, the first annealing step 1 is only a nucleation step.

It is known that too many nuclei restricts the space for grain growth. The small grain size causes the degradation of the crystalline characteristics of the dielectric layer and the quality of a capacitor. As shown in FIG. 2, the temperature is lowered down to below 500° C. in the second annealing step 2, that is, a low temperature anneal. The thermal energy is reduced as the temperature is lowered, and the speed of nucleation is reduced. The number of nucleation is thus suppressed and controlled at a certain amount.

In the third annealing step 3, that is, a high temperature anneal, the temperature is risen up to about 700° C. to 850° C., preferably to 800° C. The annealing time is about 10 seconds to 60 seconds. The nuclei formed in step 1 and step 2 start to grow by absorbing the unnucleated tantalum oxide. During step 3, the speed of grain growth is much faster than the speed of nucleation. The unnucleated tantanlum oxide is absorbed by the nuclei before being nucleated. Thus, the number of nuclei is kept at a certain amount and the nuclei have enough space to grow. Larger grain size and a better crystalline characteristic are obtained. Therefore, the leakage current is reduced, and a better quality of a capacitor is obtained.

In the invention, under different temperatures, the reaction of tantalum oxide layer during annealing process is different. The nucleaction and grain growth are performed during different steps of anneal. The number and size of grains can be controlled at a certain amount, and the leakage current is reduced.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of reducing a leakage current of a dielectric layer, comprising:

locating a substrate having a dielectric layer formed thereon into a furnace, wherein the dielectric layer is a tantalum oxide layer;

performing a first annealing step at a temperature between about 500° C. and about 700° C.;

after said performing a first annealing step, performing a second annealing step at a temperature below about 500° C.; and after said performing a second annealing step, performing a third annealing step at a temperature between about 700° C. and about 850° C.

2. The method according to claim 1, wherein tantalum oxide layer is formed by low pressure chemical vapour deposition using tetra-acetyl-ethyl-tantalum-oxide as precursor.

3. A method of reducing a leakage current of a dielectric layer, comprising:

locating a substrate having a dielectric layer formed thereon into a furnace, wherein the dielectric layer is an oxide/nitride/oxide layer;

performing a first annealing step at a temperature between about 500° C. and about 700° C.;

after said performing a first annealing step, performing a second annealing step at a temperature below about 500° C.; and after said performing a second annealing step, performing a third annealing step at a temperature between about 700° C. and about 850° C.

4. A method according of reducing a leakage current of a dielectric layer, comprising:

locating a substrate having a dielectric layer formed thereon into a furnace, wherein the dielectric layer is a BST layer;

performing a first annealing step at a temperature between about 500° C. and about 700° C.;

after said performing a first annealing step, performing a second annealing step at a temperature below about 500° C.; and after said performing a second annealing step, performing a third annealing step at a temperature between about 700° C. and about 850° C.

5. A method of reducing a leakage current of a dielectric layer, comprising:

locating a substrate having a dielectric layer formed thereon into a furnace;

performing a first annealing step at a temperature between about 500° C. and about 700° C.;

after said performing a first annealing step, performing a second annealing step at a temperature below about 500° C.; and after said performing a second annealing step, performing a third annealing step at a temperature between about 700° C. and about 850° C., wherein the first annealing step is performed for about 40 seconds to about 80 seconds, the second annealing step is performed for about 10 seconds to about 60 seconds, and the third annealing step is performed for about 10 seconds to about 60 seconds.

6. A method of reducing a leakage current of a dielectric layer with a high dielectric constant, comprising:

depositing a substrate, having a dielectric layer formed thereon, into a furnace;

performing a first annealing step so as to supply the dielectric layer for nucleation without grain growth;

after said performing a first annealing step, performing a second annealing step so as to reduce a speed of nucleation and control a number of nucleation at a certain amount; and after said performing a second annealing step, performing a third annealing step so as to make a speed of grain growth faster than the speed of the nucleation to obtain larger size and a better crystalline characteristic.

7. The method according to claim 6, wherein the dielectric layer is a tantalum oxide layer.

8. The method according to claim 7, wherein the tantalum oxide layer is formed by low pressure chemical vapor deposition using tetra-acetyl-ethyl-tantalum-oxide as precursor.

9. The method according to claim 6, wherein the dielectric layer is an oxide/nitride/oxide layer.

10. The method according to claim 6, wherein the dielectric layer is a BST layer.

11. The method according to claim 6, wherein:

the first annealing step is performed at about 500 to 700° C. and for about 40 seconds to about 60 seconds;

the second annealing step is performed below about 500° C. and for about 10 seconds to about 60 seconds; and the third annealing step is performed at about 700 to 850° C. and for about 10 seconds to about 60 seconds.

12. A method of reducing a leakage current of a dielectric layer, comprising:

locating a substrate having a dielectric layer formed thereon into a furnace;

performing a first annealing step;

performing a second annealing step; and performing a third annealing step, wherein the dielectric layer is a tantalum oxide layer, and wherein the tantalum oxide layer is formed by low pressure chemical vapour deposition using tetra-acetyl-ethyltantalum-oxide as precursor.

* * * * *